(12) United States Patent
Salman et al.

(10) Patent No.: US 10,373,944 B2
(45) Date of Patent: Aug. 6, 2019

(54) ESD PROTECTION CIRCUIT WITH INTEGRAL DEEP TRENCH TRIGGER DIODES

(71) Applicant: Texas Instruments Incorporated, Dallas, TX (US)

(72) Inventors: Akram A. Salman, Plano, TX (US); Muhammad Yusuf Ali, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 48 days.

(21) Appl. No.: 15/445,671

(22) Filed: Feb. 28, 2017

(65) Prior Publication Data

US 2018/0247925 A1  Aug. 30, 2018

(51) Int. Cl.
*H01L 27/02* (2006.01)
*H01L 29/735* (2006.01)

(52) U.S. Cl.
CPC ........ *H01L 27/0255* (2013.01); *H01L 29/735* (2013.01)

(58) Field of Classification Search
CPC ........................ H01L 27/0248; H01L 27/0255
See application file for complete search history.

(56) References Cited

U.S. PATENT DOCUMENTS

| | | |
|---|---|---|
| 2008/0258214 A1 * | 10/2008 | Jang .................. H01L 29/66719 257/336 |
| 2013/0285113 A1 | 10/2013 | Edwards et al. |
| 2013/0320396 A1 | 12/2013 | Salman et al. |
| 2015/0085409 A1 | 3/2015 | Ali et al. |
| 2015/0187752 A1 | 7/2015 | Salman et al. |
| 2015/0270253 A1 | 9/2015 | Farbiz et al. |
| 2015/0270257 A1 | 9/2015 | Edwards et al. |
| 2015/0340357 A1 | 11/2015 | Edwards et al. |
| 2015/0371985 A1 | 12/2015 | Edwards et al. |
| 2016/0079227 A1 | 3/2016 | Edwards et al. |
| 2016/0156176 A1 | 6/2016 | Kunz, Jr. et al. |
| 2016/0224716 A1 | 8/2016 | Farbiz et al. |
| 2016/0233668 A1 | 8/2016 | Dai et al. |
| 2016/0322349 A1 * | 11/2016 | Xu ...................... H01L 27/0629 |

* cited by examiner

*Primary Examiner* — Marc Anthony Armand
(74) *Attorney, Agent, or Firm* — Andrew R. Ralston; Charles A. Brill; Frank D. Cimino

(57) ABSTRACT

Disclosed examples include integrated circuits, fabrication methods and ESD protection circuits to selectively conduct current between a protected node and a reference node during an ESD event, including a protection transistor, a first diode and a resistor formed in a first region of a semiconductor structure, and a second diode formed in a second region isolated from the first region by a polysilicon filled deep trench, where the first and second diodes include cathodes formed by deep N wells alongside the deep trench in the respective first and second regions to use integrated deep trench diode rings to set the ESD protection trigger voltage and prevent a parasitic deep N well/P buried layer junction from breakdown at lower than the rated voltage of the host circuitry.

17 Claims, 13 Drawing Sheets

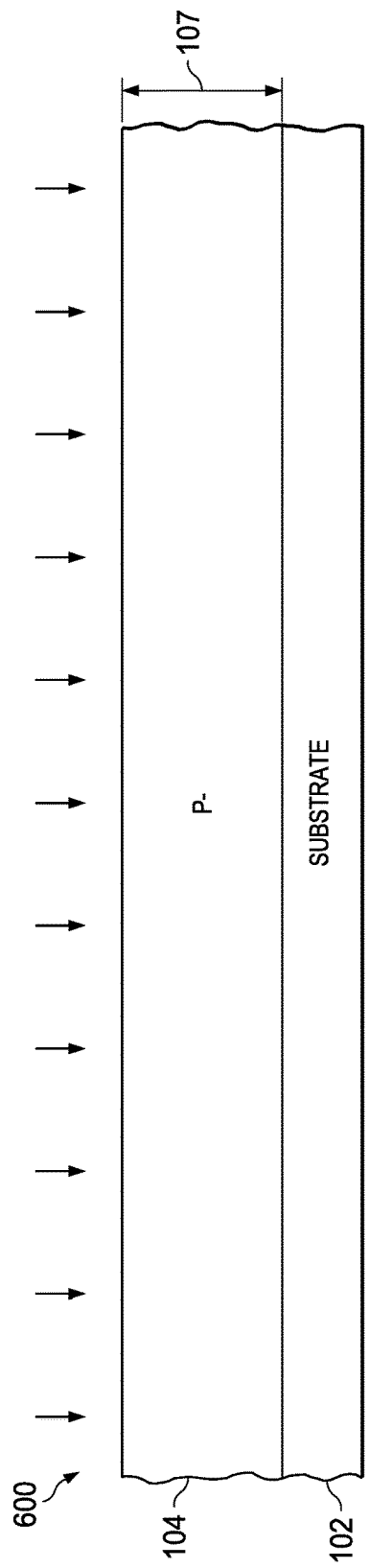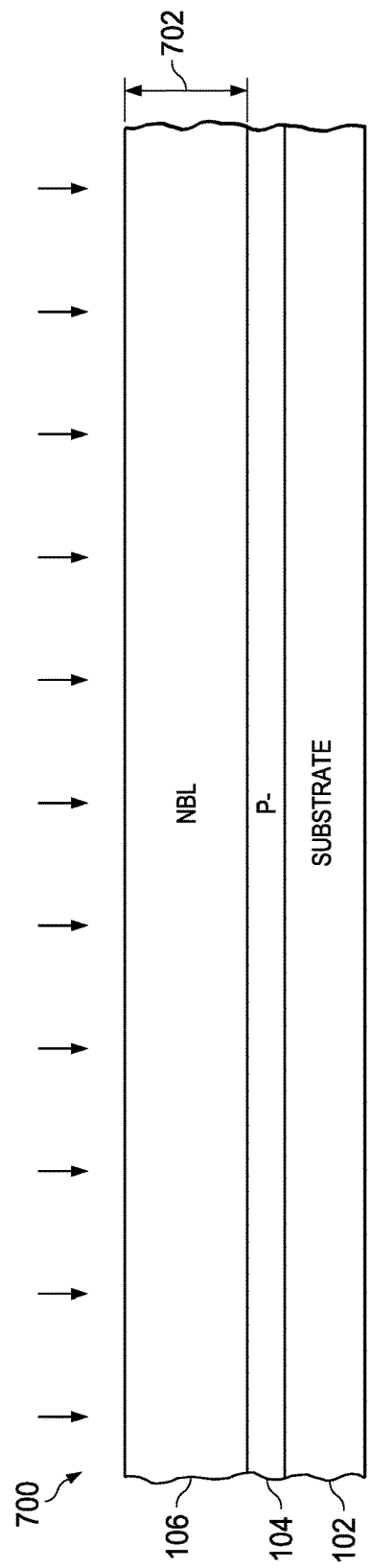

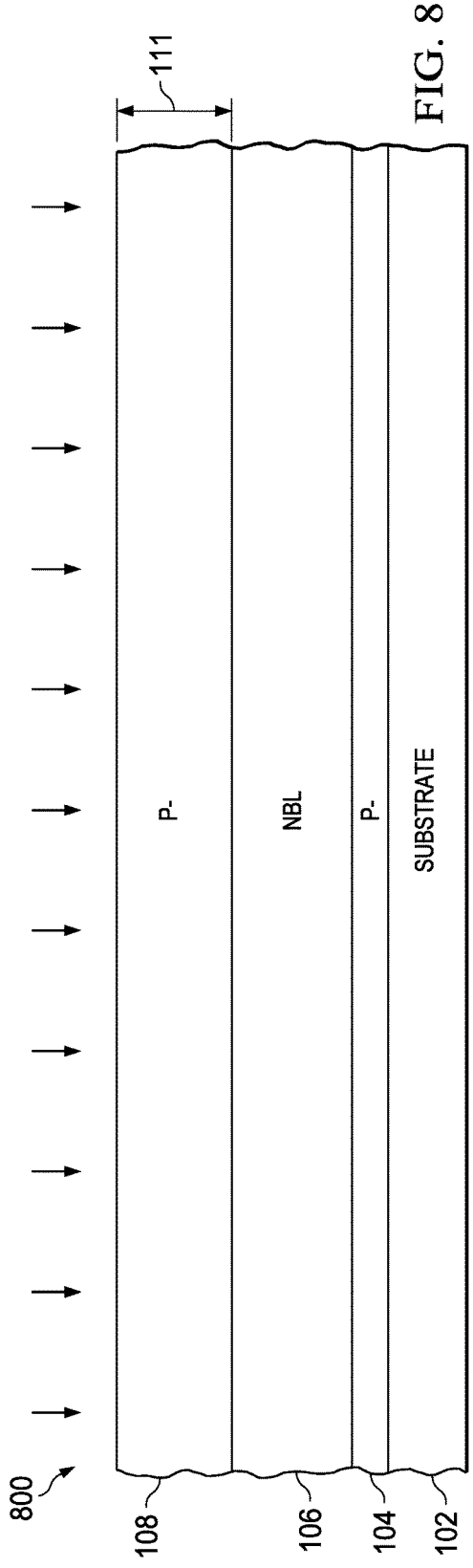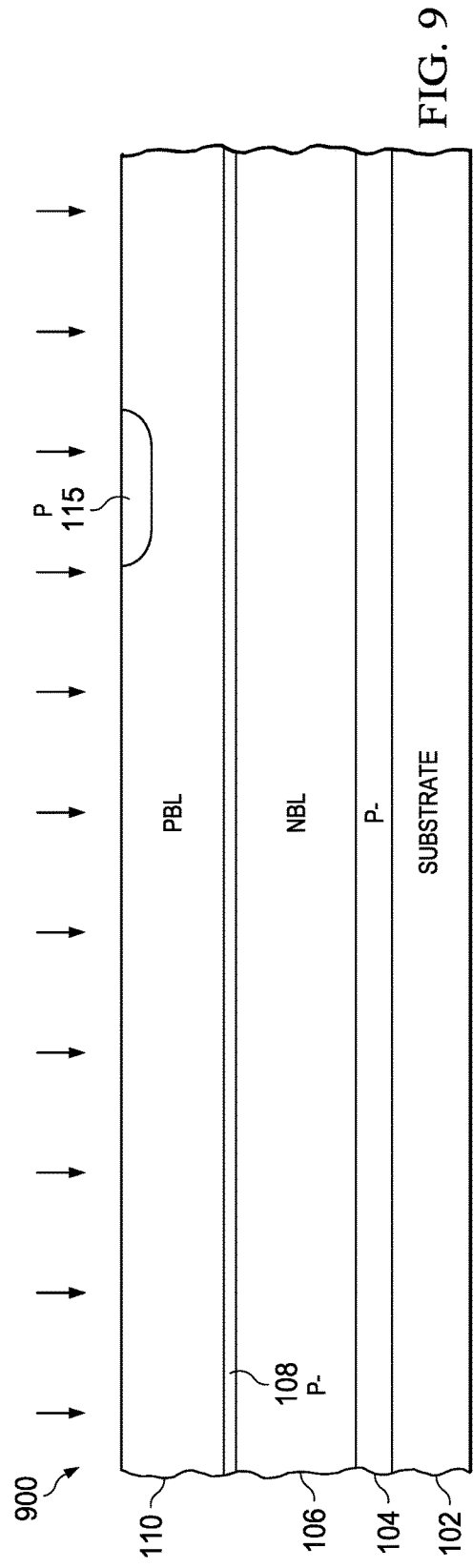

ESD PROTECTION CIRCUIT WITH INTEGRAL DEEP TRENCH TRIGGER DIODES

BACKGROUND

Electrostatic discharge (ESD) protection circuits safely discharge a protected pad or node in response to ESD events while allowing lower level signals during normal operation. The trigger voltage of an ESD clamp circuit is typically set above and expected maximum signal level for a protected pad during normal host circuit operation, with a certain amount of margin to prevent false triggering and to mitigate leakage. The trigger voltage of certain ESD protection clamps are triggered by voltage breakdown of a p/n-well junction. However, this breakdown level may be significantly higher than the normal signal level for a protected node, leading to insufficient protection. For example, lateral NPN bipolar transistors can be triggered by carrier injection into the base to conduct ESD event current to protect an I/O pad. In one self-biased approach, the NPN transistor is triggered by increasing the collector voltage to inject enough carriers into the substrate (base) to turn on the NPN. This high breakdown voltage is achieved by selectively masking a P-doped buried layer (PBL) near a deep N well at the expense of a PBL mask. Without the use of PBL mask, this breakdown voltage goes below the operating voltage making the cell useless.

SUMMARY

Disclosed examples include integrated circuits and ESD protection circuits to selectively conduct current between a protected node and a reference node during an ESD event. The ESD protection circuit includes a protection transistor, a first diode and a resistor formed in a first region of a semiconductor structure, along with a second diode formed in a second region isolated from the first region by a deep trench. The first and second diodes are connected in series with one another between the transistor control terminal and the protected node to provide a controlled trigger voltage for the ESD protection circuit. In certain examples, the diodes include cathodes formed by deep N wells alongside the deep trench in the respective first and second regions. One or more deep trench isolated diodes can be used to tailor the trigger voltage to any desired level without P-doped barrier layer masking, while using one or more integral trench-isolated diodes to provide a compact ESD trigger circuit.

BRIEF DESCRIPTION OF THE DRAWINGS

FIG. 6-14 are partial sectional side elevation views showing the integrated circuit of FIG. 1 at successive fabrication steps according to the method of FIG. 5.

DETAILED DESCRIPTION

Figure 1:
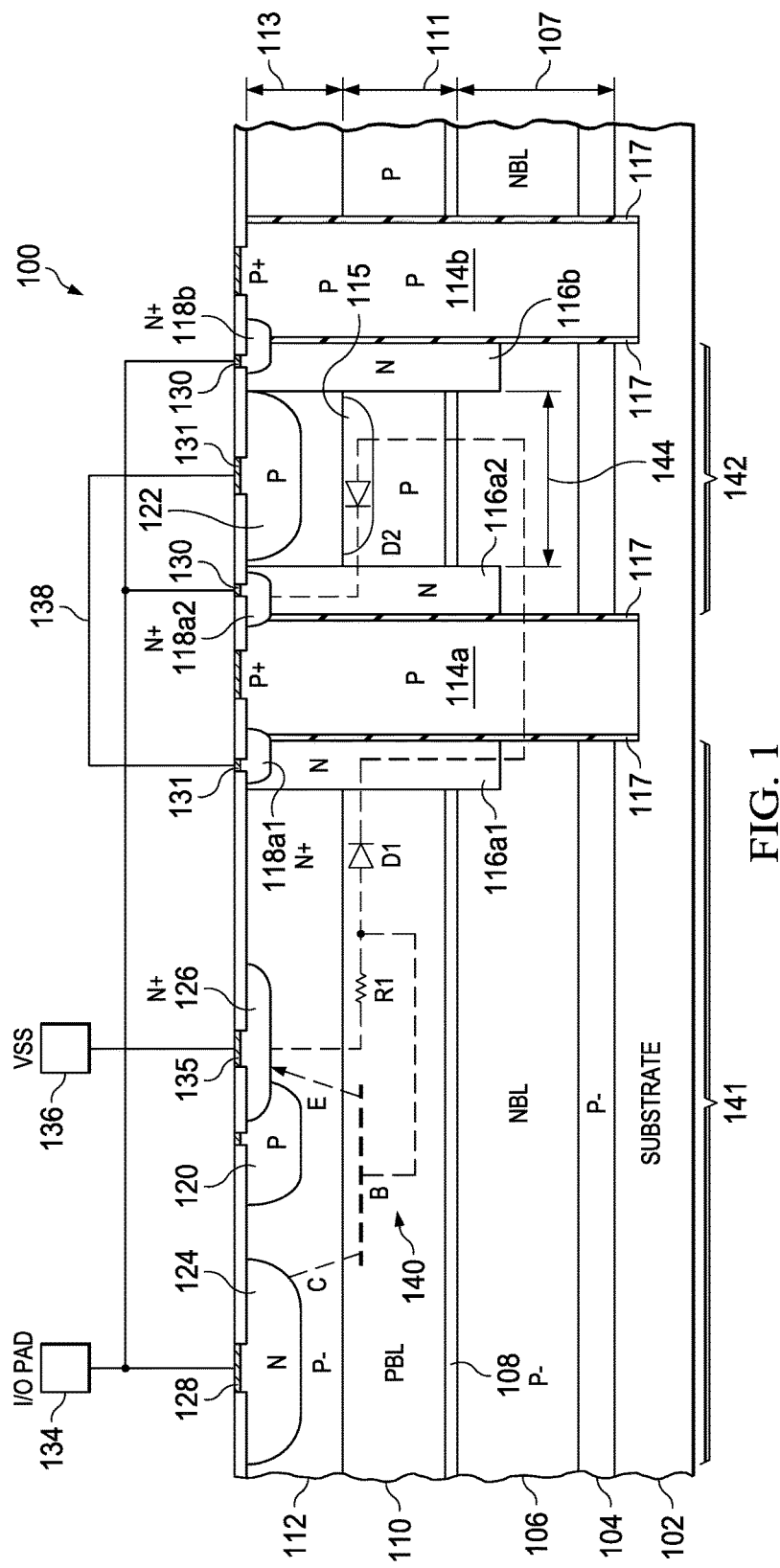
FIG. 1 is a partial sectional side elevation view schematically illustrating an integrated circuit with an ESD protection circuit including a lateral NPN bipolar transistor and a first diode formed in a first region of a semiconductor structure, and a trigger diode formed in a deep trench isolated second region of the semiconductor structure according to one embodiment.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " In addition, the terms "couple", "coupled" or "couples" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

Integrated circuits (ICs) may be damaged by an ESD event during manufacturing, assembly, testing, or during normal operation in a given application. ESD events can be initiated by contact of an IC with a charged body (e.g., a human) that causes high voltages at one or more pins, pads or terminals of the IC. ESD events can damage host circuitry of an IC through thermal runaway and resultant junction shorting and/or dielectric breakdown causing gate-junction shorting in metal oxide semiconductor (MOS) circuits when the amount of charge exceeds the capability of the electrical conduction path through the IC. Disclosed ESD protection circuits can be advantageously employed in an IC to shunt ESD current between a protected pad or node and a reference node. The protected pad may be any IC node or terminal, such as an I/O connection for transmitting or receiving a data signal, conveying an audio signal or other time varying signal, and/or other external electrical connection to an IC.

Disclosed examples facilitate tailoring of an ESD protection circuit trigger voltage without introducing additional PBL masks during fabrication, to mitigate false triggering during normal operation and to enhance proper triggering of the ESD protection transistor to quickly turn on ESD protection structures to protect host circuits of an IC from excessive positive or negative ESD voltages. As described herein, an ESD stress event can be understood as including an event on an I/O or power pad or other externally accessible node of a circuit that creates an elevated voltage (e.g., with respect to VSS or other voltage reference node), that is higher than a voltage which is normally supplied to the pad (e.g., higher than VDD or lower than a negative supply rail), or other ESD event that can stress or degrade a circuit component unless attenuated by ESD protection circuitry. For example, an ESD stress event may include events used in testing ESD immunity classification for the human body model (HBM Classes 0, 1A, 1B, 1C, 2, 3A and 3B), the charge device model (CDM Classes C1, C2, C3, C4, C5 and C6), and the machine model (MM Classes M1, M2, M3 and M4). The Human Body Model simulates ESD due to discharge from human beings, and the various levels of the HBM classifications are often used to describe an ESD stress event. CDM simulates the discharge of a charged device when it comes in contact with a conductive material, and MM represents a discharge from an object to the component. Many ICs include host circuitry that can be damaged by ESD events that deliver high voltages to one or more IC terminals (e.g., pins, pads).

FIG. 1 shows a portion of the an IC including an ESD protection circuit 100 formed in a semiconductor structure of the IC to selectively discharge a protected node 134 (e.g., an I/O pad). The semiconductor structure includes substrate 102, which can be any suitable semiconductor material, such as a silicon wafer, a silicon-on-insulator (SOI) wafer, or other suitable structure having a semiconductor material. In certain examples, the substrate 102 includes dopants, such as boron or other P type impurities. A P-doped first epitaxial layer 104 (EPI 1) is formed above the substrate 102, such as epitaxial silicon in one example. The first epitaxial layer in one example is formed to a thickness 107 of approximately 17 μm and includes boron or other P type impurities at a doping concentration of $1E15\ cm^{-3}$, although not a strict requirement of all embodiments. The first epitaxial layer 104 includes an N buried layer (NBL) 106 formed through implantation or other suitable technique in an upper portion of the epitaxial layer 104. In one example, the NBL 106 is implanted with N-type impurities, such as phosphorus, having a dopant concentration in the range of $1E18$-$1E19\ cm^{-3}$, although other concentrations may be used.

The semiconductor structure in FIG. 1 further includes a P-doped second epitaxial layer 108 (EPI 2) formed above the first epitaxial layer 104 to a thickness 111 of approximately 7.3 μm. The second epitaxial layer 108 in one example is epitaxially grown silicon, lightly doped with P type impurities (e.g., boron) with a doping concentration of approximately $1E15\ cm^{-3}$, although other concentrations may be used. A P buried layer (PBL) 110 is formed in an upper portion of the second epitaxial layer 108, for example, by implantation of P type dopants into the layer 108. The buried layer 110 can be of any suitable depth extending at least partially into the second epitaxial layer 108. In one example, the P buried layer 110 is implanted with boron or other P-type dopants to a concentration in the range of $5E16$-$5E17\ cm^{-3}$, although other concentrations may be used.

The semiconductor structure example of FIG. 1 also includes a P-doped third epitaxial layer 112 (EPI 3) formed above the second epitaxial layer 108 to a thickness 113 of approximately 6.6 μm. The third epitaxial layer 112 in this example is doped with P-type impurities, for example, boron with a dopant concentration of approximately $1E15\ cm^{-3}$, although other concentrations may be used.

The semiconductor structure further includes one or more deep trenches 114 filled with P-doped polycrystalline silicon (polysilicon), as well as deep N well structures 116. The deep N wells 116 in this example extend downward to the N buried layer 106, and the deep trenches 114 extend downward into the substrate 102. These structures isolate portions of the semiconductor structure from one another, and define a first region 141 as well as a second region 142 shown in FIG. 1. In certain examples, the deep trenches 114 and the associated deep N wells 116 are formed as ring structures, although not a requirement of all embodiments. In particular, a deep trench/deep N well structure 114, 116 in one example laterally encircles the first region 141 (although the full extent of the semiconductor structure is not shown in FIG. 1) to provide electrical isolation for an ESD protection transistor and associated diode formed in the first region 141. In certain embodiments, moreover, a deep trench/deep N well structure 114, 116 can be formed to laterally encircle the second region 142 in FIG. 1. In certain examples, the deep N wells 116 are implanted with phosphorus or other N type dopants to a concentration of $1E17$-$1E18\ cm^{-3}$, although other concentrations may be used.

A lateral NPN bipolar protection transistor 140 is formed in the third epitaxial layer 112 in the first region 141. In this example, a first N well 124 is formed in the third epitaxial layer 112 of the first region 141 to provide a collector or first transistor terminal C of the NPN transistor 140. In one example, the N well 124 is implanted with phosphorus or other N type impurities to a dopant concentration in the range of $8E16$-$2E17\ cm^{-3}$, although other concentrations may be used. The N well 124 and the transistor collector C are connected to the protected node 134 via metallization structures (not shown) formed above the top of the third epitaxial layer 112. The transistor control terminal or base B is formed by a P well 120 the P-doped third epitaxial layer 112 near the N well 124. In one example, the P well 120 is implanted with boron or other P type dopants to a dopant concentration in the range of $8E16$-$2E17\ cm^{-3}$, although other concentrations may be used. A shallow N+ well 126 is implanted in the third epitaxial layer 112 partially adjacent to the P well 120 in the first region 141 to provide the second transistor terminal or emitter E. The emitter and P well 126 are connected through metallization (not shown) to the reference node 136 (e.g., VSS). The lateral NPN bipolar transistor is further illustrated schematically in dashed-line form in FIG. 1.

A resistor R1 is formed between the second transistor terminal E, S and the transistor control terminal B, G in the first region 141. In one example, the resistor R1 is internally fabricated by the lateral resistance of a portion of the PBL between the P well 120 and the deep N well 116a1 in FIG. 1. In other implementations, the resistor R1 can be formed in a metallization structure (not shown) with connections to the base B and emitter E (e.g., connections to the wells 120 and 126). The resistor R1 provides a conduction path to conduct current from a series combination of two or more trigger diodes D1 and D2 with breakdown voltages set to properly trigger the protection transistor 140 in response to an ESD event. The N wells 124 and 126 include N+ regions near the tops thereof (not shown) and silicide or other contact structures 128 and 135 to provide low resistance conductive contacts to metallization structures used for interconnections described herein. Also, the P well 120 can include an upper P+ implant and contact structures for connection to the metallization structure. The silicide contacts are formed between intervening shallow trench isolation (STI) or field oxide (FOX) structures according to conventional fabrication processes.

Figure 3:
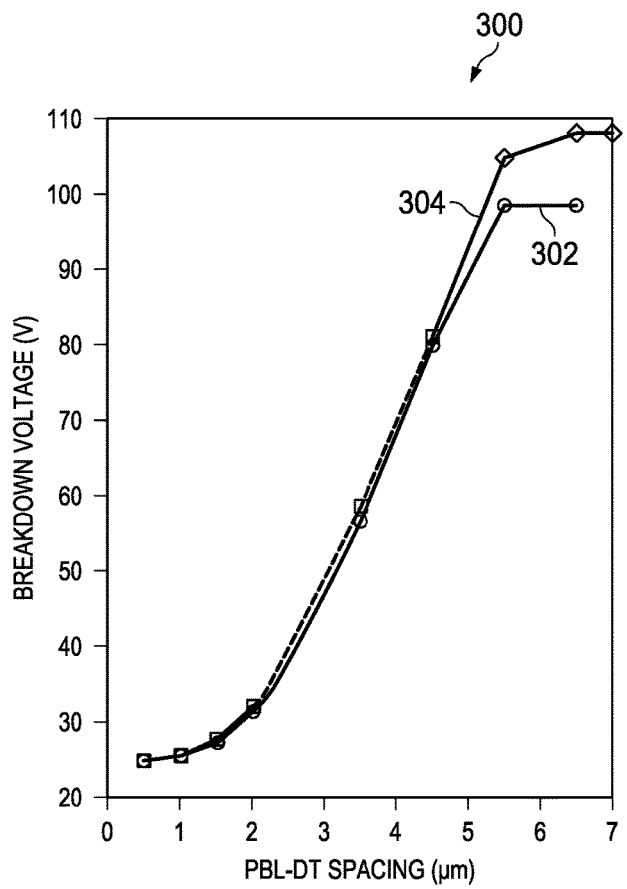
FIG. 3 is a graph of breakdown voltage as a function of deep trench/P buried layer spacing.

Referring also to FIG. 3, if the transistor 140 were to rely solely on breakdown of the parasitic junction between the N well 124 and the P-doped epitaxial layer 112, or the junction between the P buried layer 110 and the deep N well structure 116a1, triggering cannot be ensured to protect against many ESD events. In particular, the PBL to deep N well junction breakdown voltage cannot be greater than 24 V, which is too low to use for the protection of host circuitry (not shown) that operates at much higher voltage levels. The PBL generally functions to avoid punch through in IC operation. The PBL implantation processing can be done with a mask to pull the PBL 110 laterally away from the deep N well 116a1 to support higher voltage levels, but this approach adds manufacturing cost due to an extra mask. FIG. 3 illustrates graph 300 showing breakdown voltage as a function of deep trench/P buried layer spacing in the semiconductor structure. Curve 302 shows the breakdown voltage for a 7.0 μm spacing between the deep trench 114 and the PBL 110, and the curve 304 illustrates the breakdown voltage for a 7.4 μm spacing. Disclosed examples include a first diode D1 and a resistor R1 formed in the first region 141, and a second diode D2 formed in the second region 142. The diodes D1 and D2 include cathodes formed by the deep N wells 116 alongside the deep trench 114 to use integrated deep trench diode rings to set the ESD protection circuit trigger voltage and prevent a parasitic deep N well/P buried layer junction from breakdown at lower than the rated voltage of the host circuitry.

The deep trenches 114a and 114b in FIG. 1 include $SiO_2$ or other oxide material sidewalls 117 and the trenches 114 are filled with P-doped polysilicon. The trenches 114 extend downward through the epitaxial layers 104, 108 and 112 and into the substrate 102 between first and second regions 141 and 142. The first deep N well 116a1 extends laterally outward from at least a portion of the deep trench 114a in the first region 141. The deep N well 116a1 extends downward through the second and third epitaxial layers 108 and 112 and into the N buried layer 106 of the first epitaxial layer 104. A second deep N well 116a2 extends laterally outward from at least a portion of the deep trench 114 in the second region 142. The N well 116a2 extends downward through the epitaxial layers 108 and 112 and into the N buried layer 106 of the first epitaxial layer 104. In one example, the deep N wells 116 are implanted with phosphorus or other N type impurities to a dopant concentration in the range of $1E17$-$1E18$ cm$^{-3}$, although other concentrations may be used.

The first region 141 includes a first diode D1, shown schematically in dashed line form in FIG. 1. The diode D1 includes a first anode connected to the transistor control terminal B, G in the P-doped portions 110, 112 of first region 141, and a first cathode formed by the first deep N well 116a1 in the first region 141. The cathode of D1 and the deep N well are connected to a metallization node 138 via an N+ doped shallow well 118a1 and a corresponding silicide contact 131 at the top of the well 116a1. A second diode D2 has an anode formed by a P well 122 in the third epitaxial layer 112 of the second region 142, as well as a shallow P well 115 formed at the top of the PBL 110 in the second epitaxial layer 108. The P well 120 in one example is implanted with Boron or other P type impurities to a dopant concentration in the range of $8E16$-$2E17$ cm$^{-3}$, and the P well 115 is implanted with P type impurities to a dopant concentration in the range of $4$-$9E17$ cm$^{-3}$, although other concentrations may be used. The metallization structure includes connection of a silicide contact 131 of the P well 122 to connect the anode of D2 to the first cathode of D1. This connects D1 and D2 in series with one another. The second diode D2 includes a second cathode formed in the second deep N well 116a2 in the second region 142. The N well 116a2 includes a shallow upper N+ well 118a2 with a silicide contact 131 coupled through metallization with the protected node 134.

Figure 2:
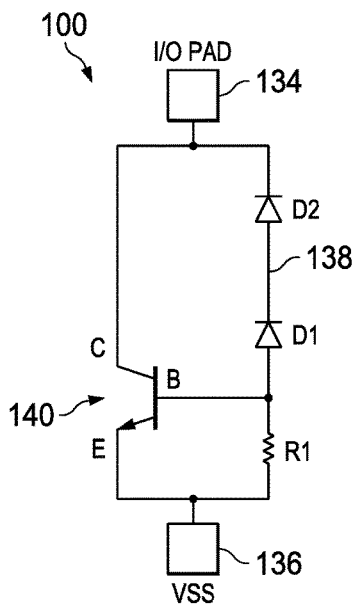
FIG. 2 is a schematic diagram showing the ESD protection circuit of FIG. 1 with the first and second diodes connected in series between the transistor control terminal and the protected node.

Referring now to FIGS. 1 and 2, FIG. 2 illustrates the schematic connection of the ESD protection circuit 100 of FIG. 1. The diodes D1 and D2 are connected in series with one another between the base control terminal B of the NPN transistor 140 and the protected node 134. The resistor R1 is connected between the base control terminal B and the reference node 136 (VSS). In operation at normal signal levels of the protected node 134, the diodes D1 and D2 a reverse biased, and no current flows in the resistor R1. As a result, the control terminal voltage at the base B is at the voltage of the reference node 136, and the protection transistor 140 is turned off. In this condition, host circuitry of the associated integrated circuit can apply or receive signal level voltages at the I/O pad reference node 134, and the protection circuit 140 does not interfere with normal operation of the host circuit. During an ESD event that raises the I/O pad voltage at the reference node 134 above the trigger voltage of the circuit 100, the diodes D1 and D2 breakdown, causing current flow in the resistor R1. This raises the base control voltage of the protection transistor 140, which turns on to safely discharge the protected node 134. In this design, the breakdown voltages of the diodes D1 and D2 set the trigger voltage for the protection circuit 100. In addition, as seen in FIG. 1, the diodes D1 and D2 are integral to the semiconductor structure, with the second diode D2 being fabricated in a deep trench ring structure defining the second region 142 isolated from the first region 141. Accordingly, the disclosed solutions do not suffer from the area impact of adding external diodes for the ESD protection circuitry, and also allow tailoring of the protection circuit trigger voltage for specific applications. Two or more isolated diodes D2-1, D2-2, D2-N can be provided in corresponding additional deep trench rings, connected in series with the first diode D1, for example, as illustrated and described below in connection with FIGS. 15 and 16 to allow tailoring of the protection circuit trigger voltage for a given end use application. This solution provides an easy stackable option by including enough trigger circuit diodes to reach an appropriate trigger voltage above the normal operating signal voltage levels encountered at the protected node 134, while providing low enough trigger voltage to protect the host circuit against expected ESD events. Moreover, the disclosed examples provide a workable solution without requiring extra masks for the PBL implant 110.

Returning to FIG. 1, the second deep trench 114b has oxide sidewalls 117 and is filled with P-doped polysilicon in similar fashion as the first deep trench structure 114a. In one example, the deep trench structures 114a and 114b can be portions of a single structure formed as a deep trench ring or other circuitous deep trench structure that laterally surrounds the second region 142 and isolates the second region 142 from the first region 141, although not required of all possible implementations. A further deep N well 160b is formed along the side of the second deep trench structure 114b in the second region 142, and is implanted with N type dopants (e.g., phosphorus) in similar fashion to the second deep N well 116a2 in one example. Where the trench structures 114a and 114b form a unitary ring structure, the deep N wells 116a2 and 116b can also be a unitary ring structure formed along the interior sidewalls of the unitary trench ring structure 114a, 114b. An N+ well 118b is formed at the top of the deep N well 116b, with a silicide or other conductive contact structure 130 formed therein to provide electrical connection of the deep N well 160b to the protected node 134. The second diode D2 includes a cathode formed by the deep N Wells 116a2 and 116b which is connected to the protected node, and the anode of D2 is connected by the metallization structure node 138 to the cathode of the first diode D1 as schematically illustrated in FIG. 1. The anode of D2 is formed by the P-doped portions of the PBL 110 and the P-doped third epitaxial silicon layer 112. In the illustrated example, moreover, the additional P well 115 formed in the P buried layer 110 of the second region 142 provides additional control of the breakdown voltage of D2. In the example of FIG. 1, the P-doped anode portion of the second diode D2 has a lateral width 144 between the inner boundaries of the deep N Wells 116a2 and 116b.

Figure 4:
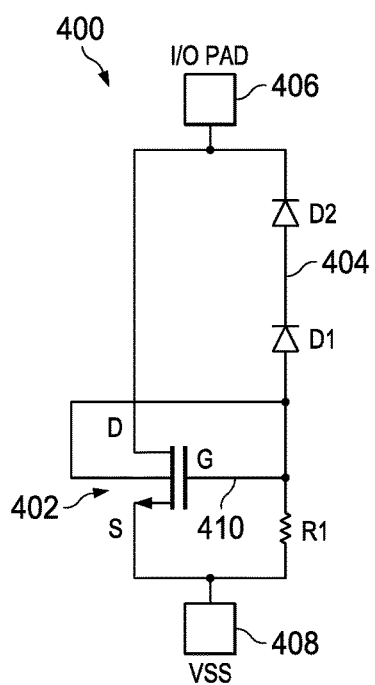
FIG. 4 is a schematic diagram showing another example ESD protection circuit including an NMOS protection transistor with first and second trigger diodes connected in series according to another embodiment.

Referring also to FIG. 4, the above concept can be used in conjunction with other types or forms of protection transistor. FIG. 4 shows another example ESD protection circuit 400 that includes an NMOS protection transistor 402 with first and second trigger diodes D1 and D2 connected in series with one another between a gate control terminal node 410 and a protected node (e.g., I/O pad) 406. This example also includes a resistor R1 connected between the control terminal (gate G) of the protection transistor 402 and a reference node 408 (e.g., VSS). A first transistor terminal (drain D) of the protection transistor 402 is connected to the protected node 406, and a second transistor (source S) of the NMOS protection transistor 402 is connected to the reference node 408. In this case, the cathode of the first diode D1 is connected to the anode of the second diode D2 via a metallization connection 404 two connect the trigger diodes D1 and D2 in series between the gate G of the transistor 402 and the protected node 406. In addition, the body of the protection transistor 402 is connected to the anode of the diode D1 as schematically shown in FIG. 4. In operation, the protection circuit 400 operates in similar fashion to the protection circuit 100 of FIG. 2. During normal operation, the voltage levels at the protected node 406 are low enough to prevent breakdown of the diodes D1 and D2, and thus no current flows through the resistor R1. As a result, the voltage at the gate node 410 is at the voltage VSS of the reference node 408, and the protection transistor 402 is turned off. During an ESD event that raises the voltage at the protected node 406, the trigger transistors D1 and D2 breakdown, causing current flow through the resistor R1. This creates a positive gate-source voltage that turns on the protection transistor 402. With the transistor 402 on, ESD current flows from the protected node 406 to the reference node 408, thereby discharging the voltage at the protected node 406 and protecting associated host circuitry (not shown). Further details of an example IC implementation of the protection circuit 400 are illustrated and described below in connection with FIG. 17.

Illustrated protection circuits 100 and 400 provide trigger control solutions for ESD protection by using integrated deep trench diode rings or other isolated first and second region 141, 142 and associated diodes in conjunction with the parasitic diode associated with the deep trench ring of the ESD device to control the trigger voltage and also to prevent the parasitic deep N well/PBL junction from breakdown at lower than the rated voltage of the application without the need to block the PBL implant through masking. A stack of deep trench diode connected to the isolation tank of the ESD NPN/MOS protection transistor 140, 402 advantageously prevents the early breakdown of the deep N well/PBL junction and allows control of the trigger voltage of the ESD protection circuitry 100, 400. Dual deep trench isolation connected in a diode stack in these examples provides uniform high voltage trigger voltage control with blanket PBL implant (no PBL mask needed), and the use of integrated deep trench diodes mitigates area penalties for constructing stacked diodes.

Referring now to FIGS. 5-14, FIG. 5 illustrates a process or method 500 to fabricate an integrated circuit IC according to further aspects of the present disclosure. The method 400 used to construct the above-described IC 100 or the IC 400 of FIG. 17 below, including formation of ESD protection circuitry with bipolar or MOS protection transistors 140, 402. A semiconductor structure is formed at 502, 504, 506, 508 and 510 in FIG. 5, including a substrate 102, and a P-doped portion above an N buried layer 106. At 502 in FIG. 5, a first epitaxial layer (EPI 1 layer 104 in FIG. 1) is formed over a substrate (substrate 102). FIG. 6 illustrates this step, including an epitaxial silicon growth process 600 used to form the first epitaxial layer 104 to a thickness 107 on the upper surface of the starting substrate 102. In one example, the first epitaxial layer is formed at 502 to a thickness 107 of approximately 17 µm and includes boron or other P type impurities at a doping concentration of 1E15 cm$^{-3}$. At 504, the upper portion of the first epitaxial layer 104 is implanted with N type impurities (e.g., phosphorus) to form an N buried layer (e.g., NBL 106). As shown in FIG. 7, and implantation process 700 is used to form the NBL 106 to a depth of 702 in the upper portion of the first epitaxial layer 104. The NBL 106 is implanted using the process 700 in one example with phosphorus to achieve a dopant concentration in the range of 1E18-1E19 cm$^{-3}$.

Figure 5:
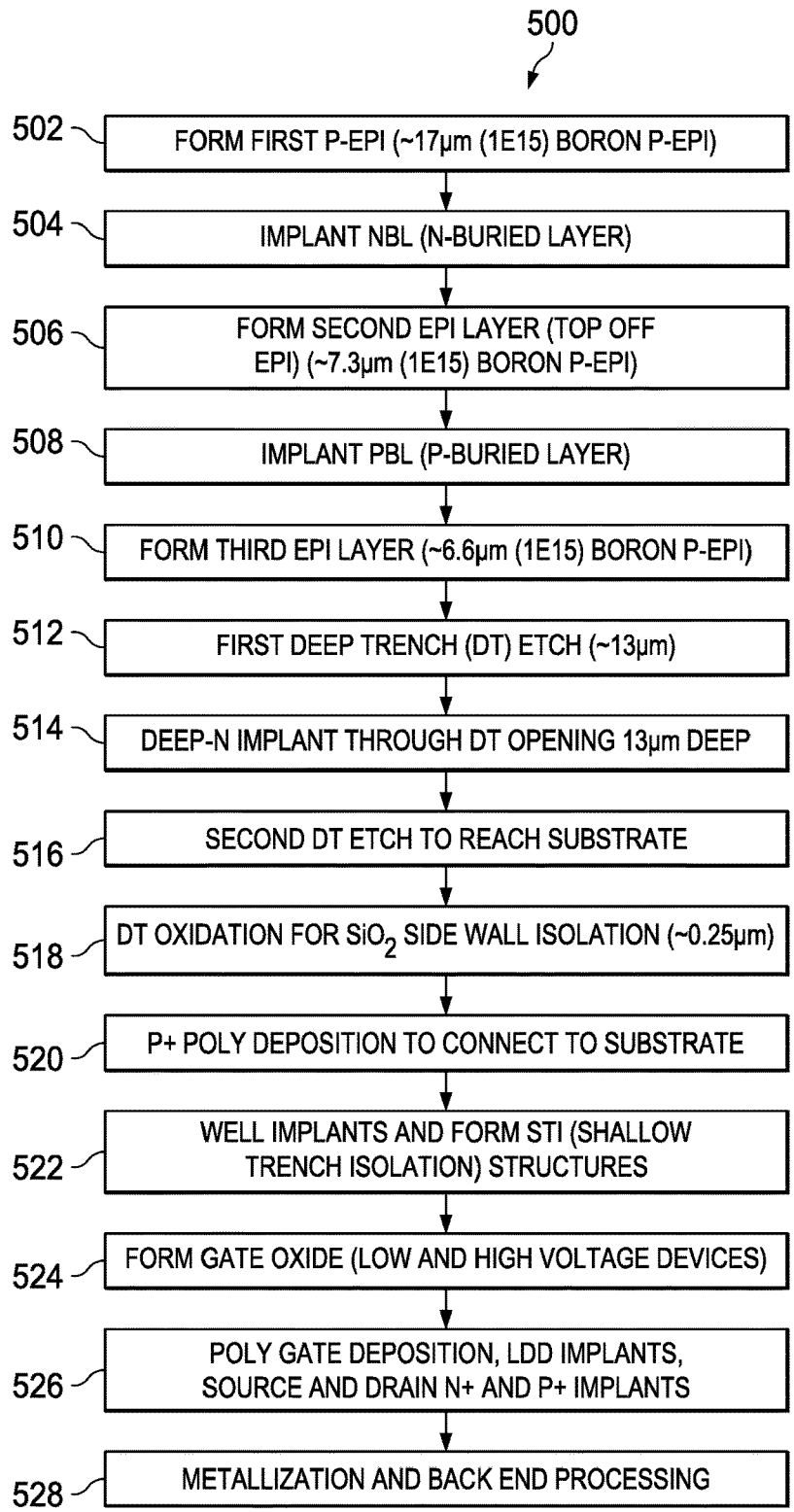
FIG. 5 is a flow diagram showing an example method to fabricate an integrated circuit according to another embodiment.
Figure 10:
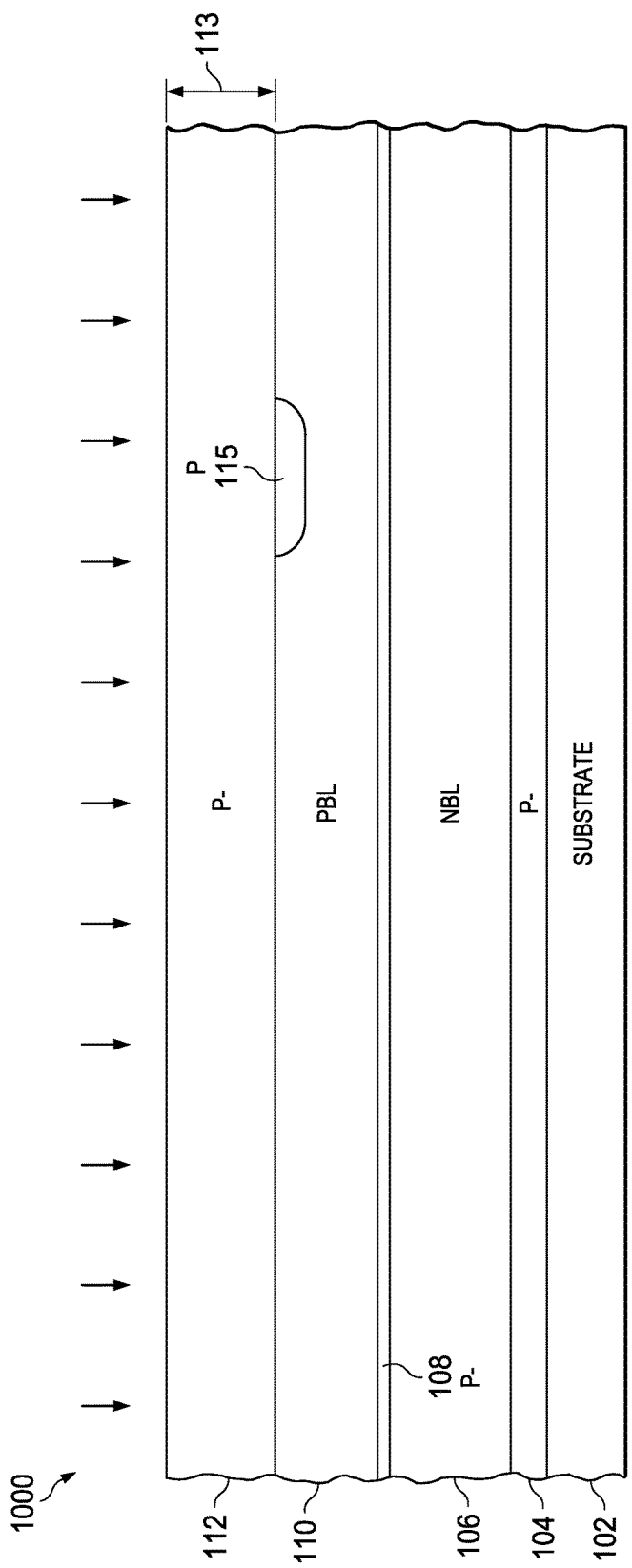

A second epitaxial layer (e.g., EPI 2) is formed at 506 in FIG. 5, which may be referred to as a "top-off" epi. FIG. 8 shows an example in which an epitaxial growth process 800 is performed to create the second epitaxial layer 10828 thickness 111. In this example, the second epitaxial layer 108 is P-doped epitaxial silicon formed to a thickness 111 of approximately 7.3 µm, lightly doped with P type impurities (e.g., boron) to a doping concentration of approximately 1E15 cm$^{-3}$. At 508, a P buried layer is implanted in the second epitaxial layer 108, for example, using an implantation process 900 shown in FIG. 9 to form the PBL 110. In one example, the P buried layer 110 is implanted with boron or other P-type dopants to a concentration in the range of 5E16-5E17 cm$^{-3}$. In one example, moreover, one or more P wells 115 are implanted in the PBL 110, as further shown in FIG. 9. Any suitable implantation process can be used with a mask (not shown) to selectively form the P well 115. In one example, the P well 115 is implanted with boron or other P type impurities to a dopant concentration in the range of 4-9E17 cm$^{-3}$. At 510 in FIG. 5, a third epitaxial layer (e.g., EPI 3, 112 in FIG. 1) is formed above the second epitaxial layer 108 to a thickness 113, for example, approximately 6.6 µm. FIG. 10 illustrates an epitaxial growth process 1000 to form the third epitaxial layer 112 over the PBL 110 and any included P well 115 of the second epitaxial layer 108.

Figure 11:
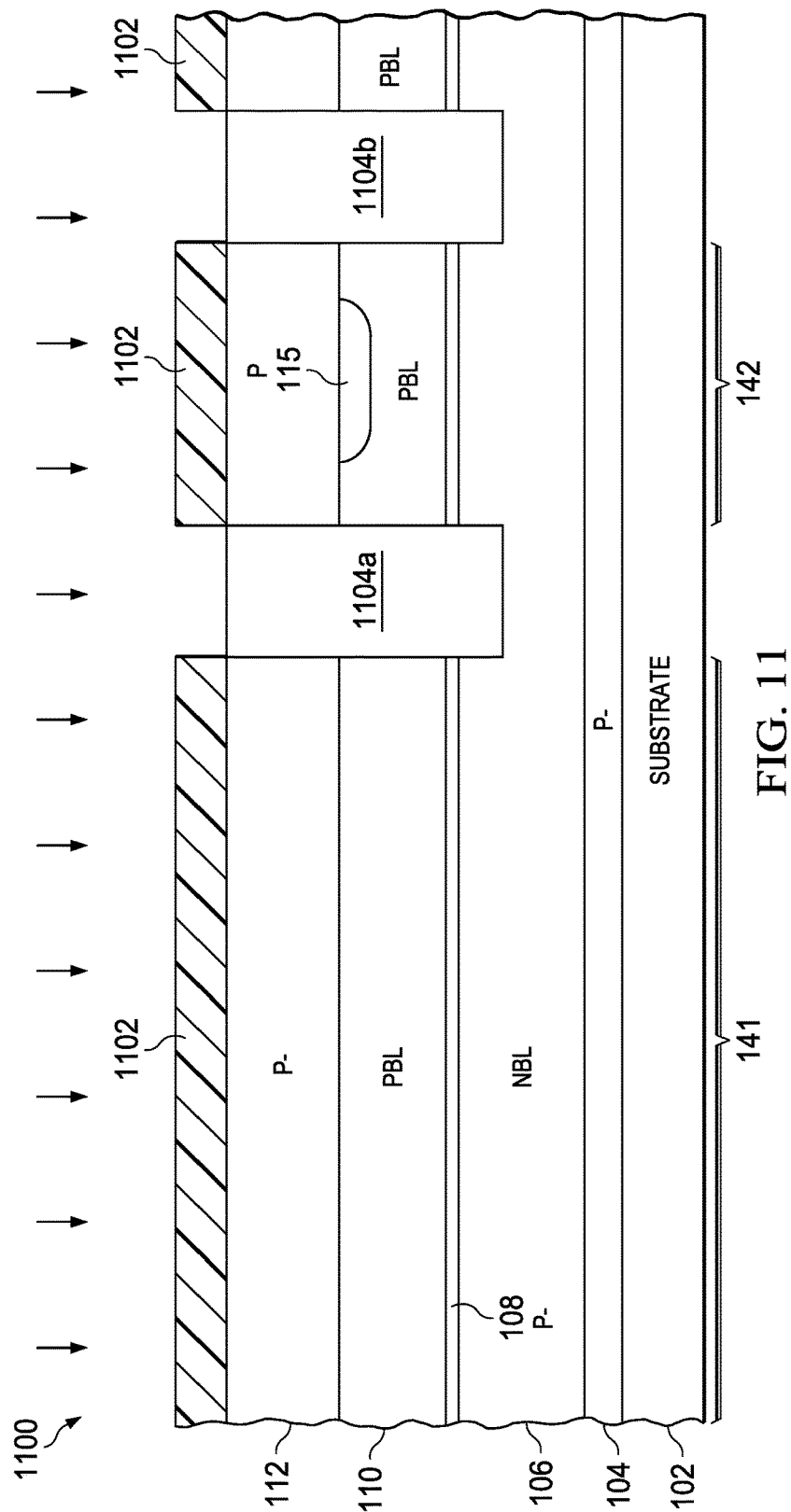
Figure 12:
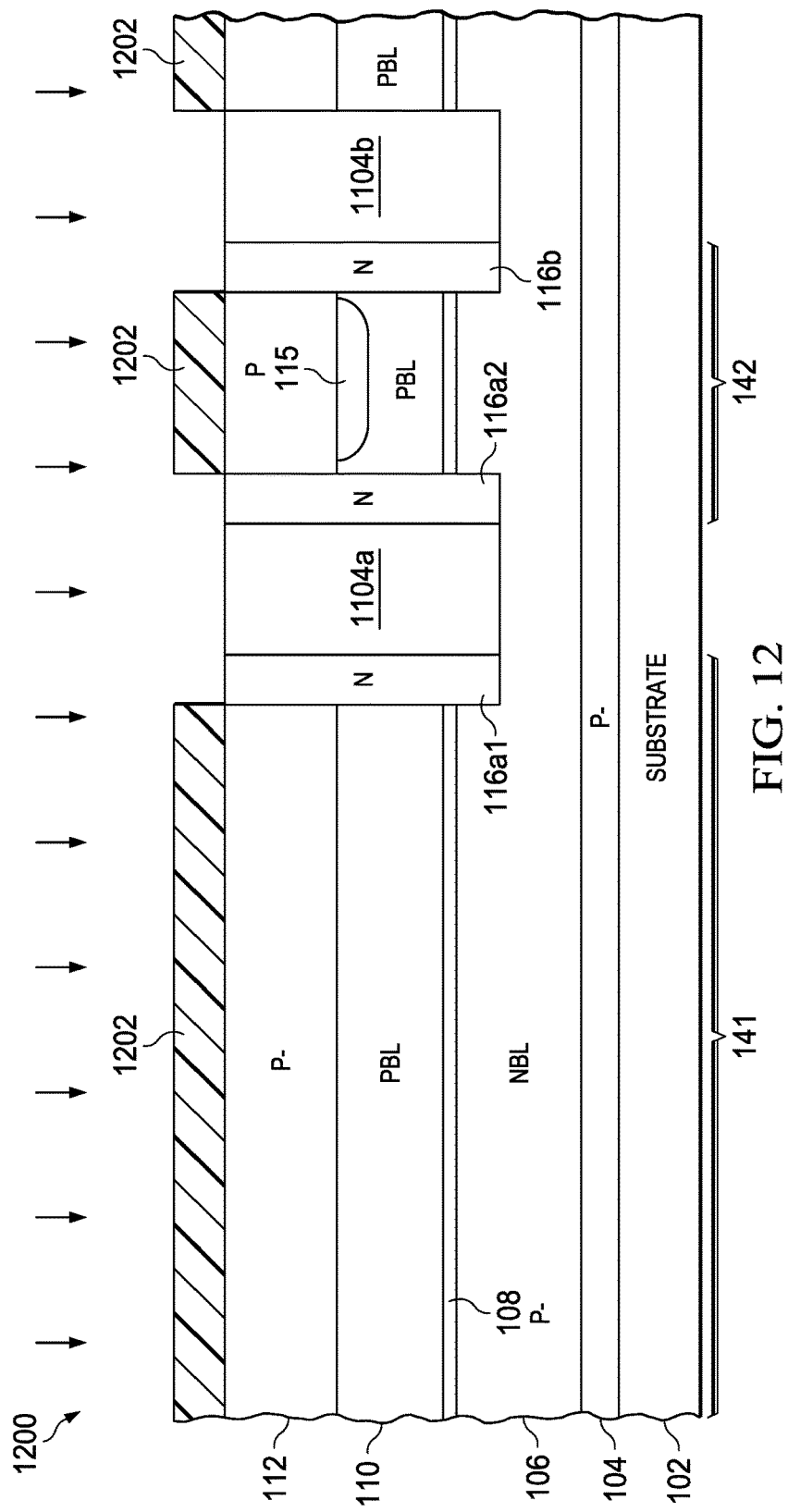

The process 500 in FIG. 5 further includes forming one or more deep trenches 114, with oxidized sidewalls 117 and polysilicon filling at 512, 516, 518 and 520. The deep trench or trenches 114 are formed through the P-doped portion and the N buried layer 106 of the previously formed semiconductor structure, and extend into the substrate 102 to define isolated first and second semiconductor structure regions 141 and 142, respectively. As shown in FIG. 11, a first deep trench (DT) etch process 1100 is used to etch the illustrated deep trenches 1104a and 1104b at 512 in FIG. 5 to a depth of approximately 13 μm in one example. Any suitable etch process 1100 can be used at 512, using a suitable etch mask 1102 as shown in FIG. 11. In this example, the etch process 1100 creates the partial deep trenches 1104 through the second and third epitaxial layers 108 and 112 and into the N buried layer 1106 of the first epitaxial layer 104. At 514 in FIG. 5, a deep N implant is performed through the deep trench openings to create the deep N wells 116a1, 116a2 and 116b. This is illustrated in FIG. 12, using an implantation process 1200 and a corresponding implant mask 1202 with openings larger than the deep trench dimensions to form the deep N wells 116. In one example, the deep N wells 116 are implanted with phosphorus or other N type dopants to a concentration of 1E17-1E18 cm$^{-3}$ using the process 1200 and the mask 1202.

Figure 13:
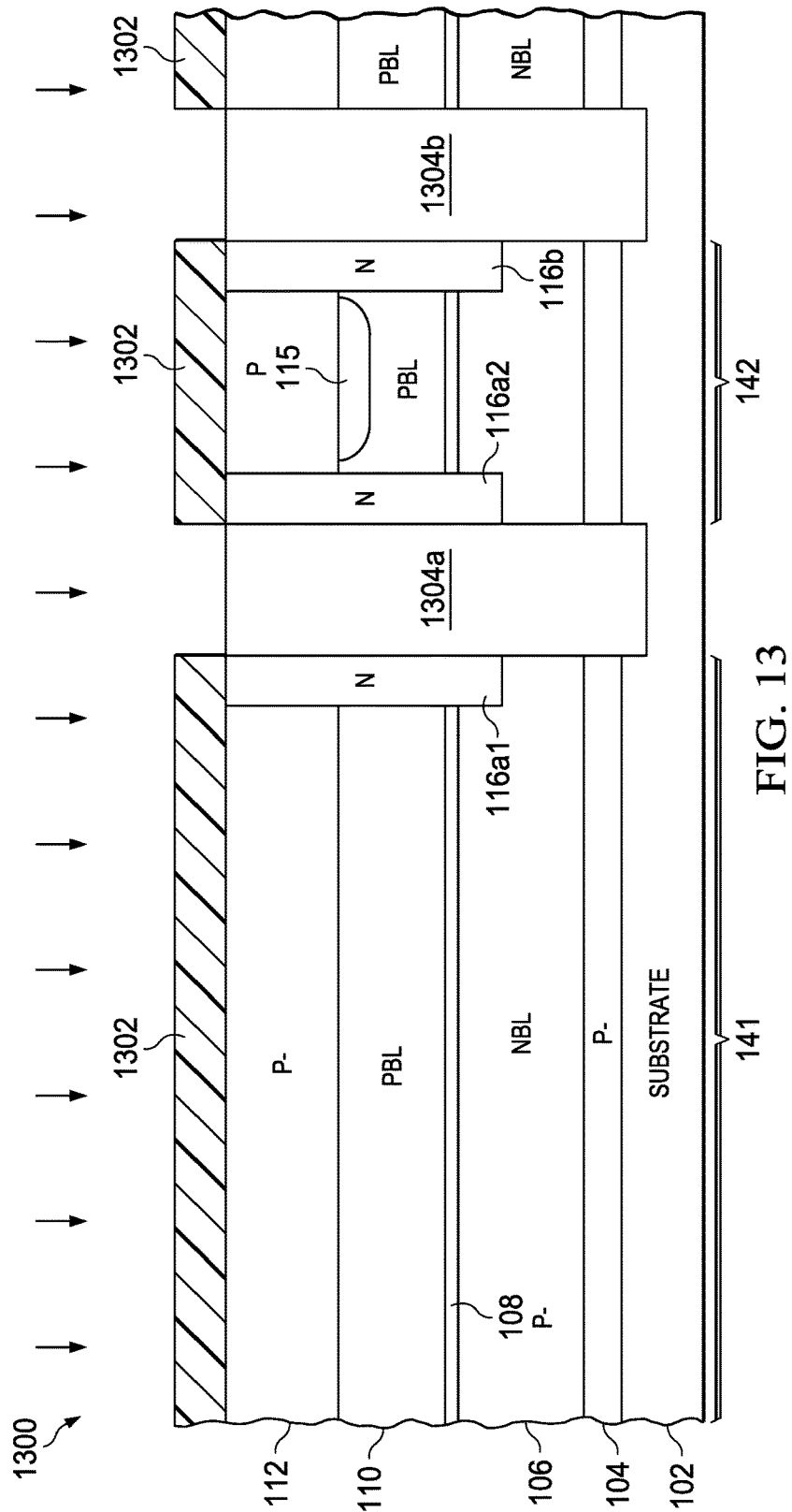
Figure 14:
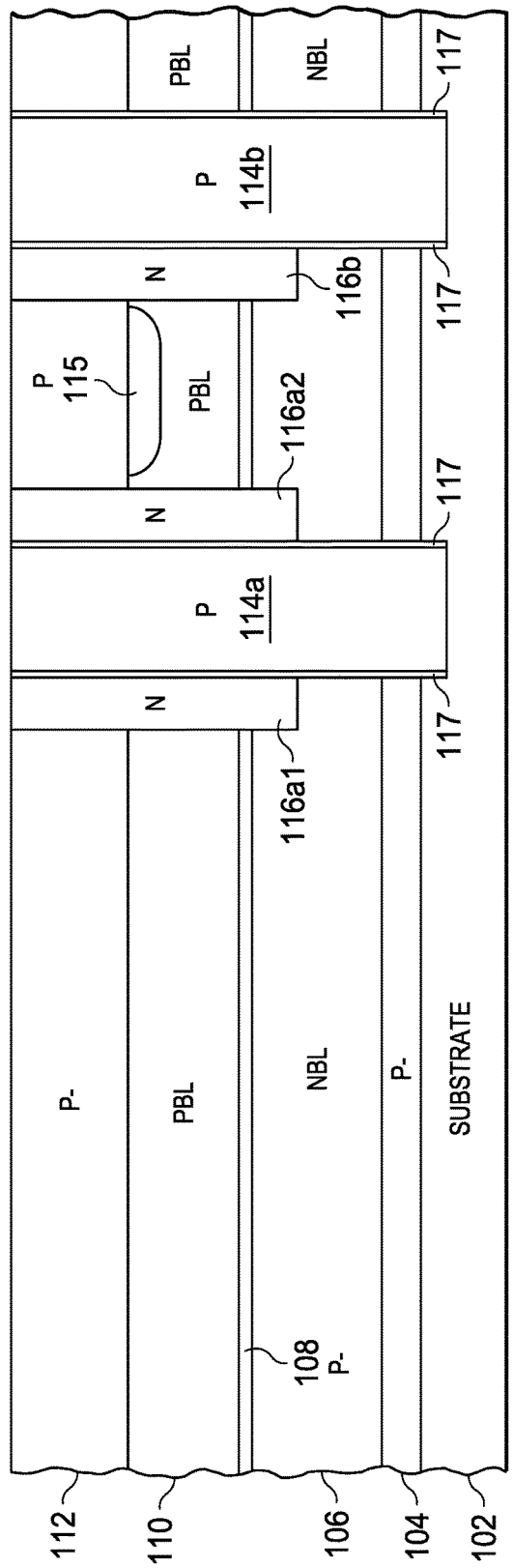

As further shown in FIG. 13, the bifurcated deep trench formation continues at 516 in FIG. 5 with a second deep trench etch to reach the substrate 102. As shown in FIG. 13, a second trench etch mask 1302 is provided, and an etch process 1300 continues the removal of material to extend the deep trenches 1304a and 1304b through the remainder of the first epitaxial layer 104 and into the substrate 102. At 518 in FIG. 5, a deep trench oxidation step is performed in order to create silicon dioxide (SiO$_2$) or other oxide material 117 along the sidewalls of the trenches, and the trenches are filled at 520 with polysilicon 114a and 114b as shown in FIG. 14. In the illustrated example, the deep trenches are partially hatched, followed by the deep N implant through the openings, and then the trenches are further extended deeper to reach the substrate 102. The trench oxidation at 518 provide sidewall isolation, and then the trenches are filled with P+ polysilicon.

The resulting structure of FIG. 14 is then further processed at 522, 524 and 526 in FIG. 5 to form the protection transistor 140 as well as the diodes D1 and D2 as described above and as shown in FIG. 1. At 522, various well implant steps are performed, and shallow trench isolation (STI) or field oxide (FOX) structures are formed using conventional semiconductor fabrication processing steps, and any required gate oxide structures (not shown) are formed at 524 to accommodate low and high voltage transistors formed as part of the integrated circuit (not shown). At 526, a polysilicon gate deposition process is performed, along with lightly doped drain (LDD) implants, source and drain (N+ and P+) implants, and other typical CMOS or bipolar fabrication steps are performed. Thereafter at 528, metallization structures are fabricated and other backend processing is performed to complete the integrated circuit. This processing at 528 includes fabrication of a suitable multi-layer metallization structure to create the interconnections schematically shown in FIG. 1.

As seen in FIG. 1, the fabrication at 514 of the deep N wells 116 in the first region 141 and the second region 142 provides the integrated diode structure is D1 and D2 for control triggering of the protection circuitry 100, 400. The metallization processing at 528 electrically couples the first cathode 131 with the second anode 131, couples the second cathode 130 and the collector C with the protected node 134, and couples the emitter E with the reference node 136. Thus, an integrated fabrication process 500 can be used to form a compact protection circuit 100 to facilitate control triggering of the protection transistor 140 without masking the PBL layer 110, which uses integrated trigger diodes D1 and D2 to conserve circuit area in the IC.

Figure 15:
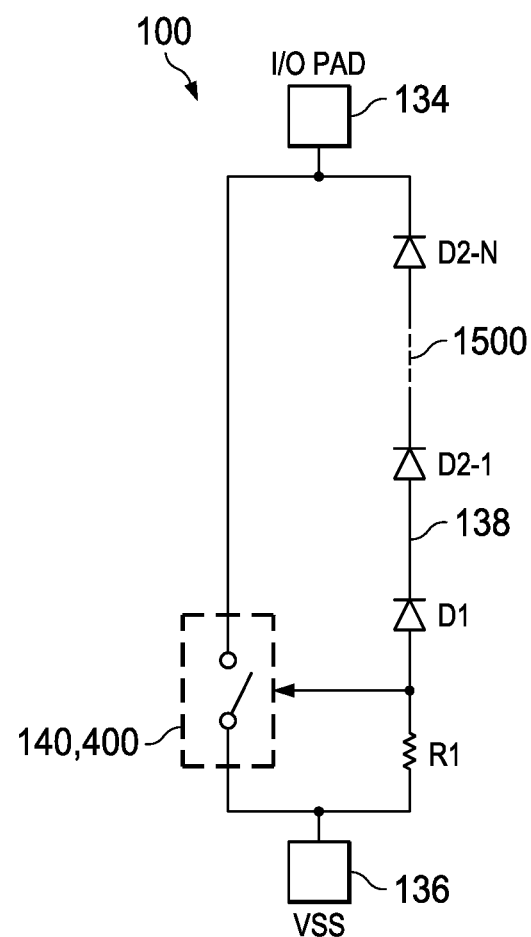
FIG. 15 is a schematic diagram showing another example ESD protection circuit including a protection transistor and a first trigger diode, as well as a plurality of trench-isolated diodes connected in series to control a trigger voltage of the protection circuit.
Figure 16:
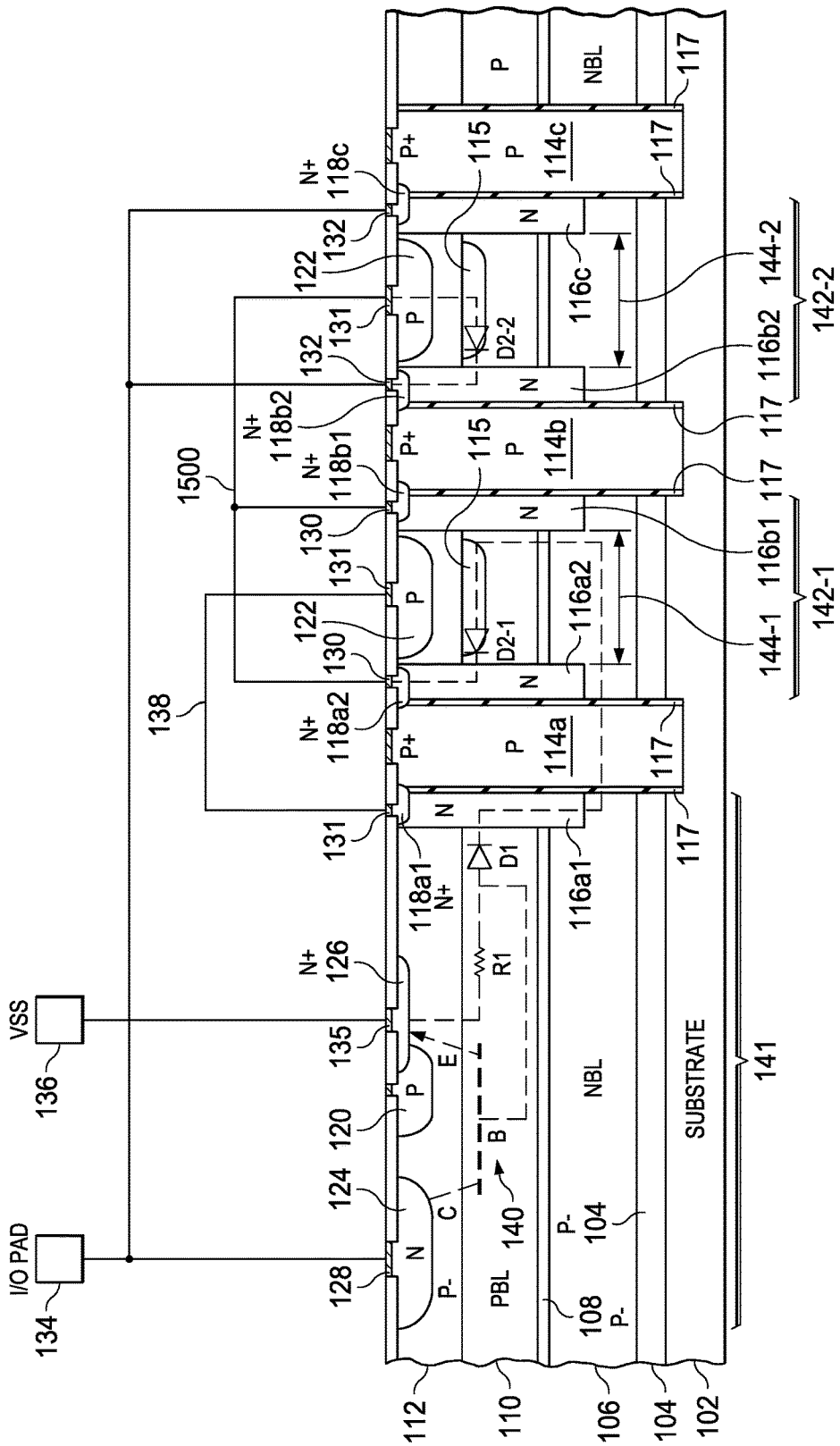
FIG. 16 is a partial sectional side elevation view showing another example ESD protection circuit with a lateral NPN bipolar protection transistor and a first diode formed in a first region of a semiconductor structure, as well as second and third trigger diodes formed in associated deep trench isolation rings.

Referring now to FIGS. 15 and 16, the above concept can be extended to examples with multiple integrated diodes using deep trench rings to trigger the protection transistor. These further embodiments implement integrated trigger transistors for controlled trigger voltage without requiring an extra mask and processing to block the PBL 110 around the deep N well junction of the deep trench structures 114. In such examples, the trigger voltage is controlled through the number of diodes D2 as well as using other surface implants and associated junctions (e.g., P well/shallow P well/PSD to deep N well) to control the trigger voltage of each diode D2 in the stack. Illustrated examples divide area efficient solutions through the use of vertical deep trench diode rings surrounding the deep trench ring of the ESD device. In certain implementations, the deep trenches 114 and the associated deep N wells 116 are formed as concentric rings, with an inner ring including the first region 141 with the protection transistor 140, 400 and the first diode D1, along with encircling rings providing the second region 142 and further isolated regions associated with respective vertical trigger diodes D2. The solutions provide simplified designs for statically triggered ESD protection cells that can be individually associated with specific corresponding protected nodes (e.g., IC pads or pins) without additional components and/or the penalty of large area. This approach, moreover, is particularly suited to ESD protection for high voltage pins where the protected pad or pin needs to tolerate high signal swings during normal operation, as the solution allows tailoring of the ESD protection trigger voltage for each protected node of the IC. Moreover, disclosed examples provide a cost effective solution while mitigating or avoiding the use of a PBL block mask, allowing the presence of a uniform PBL 110 to prevent punch through, in combination with high voltage rating ESD protection.

Figure 17:
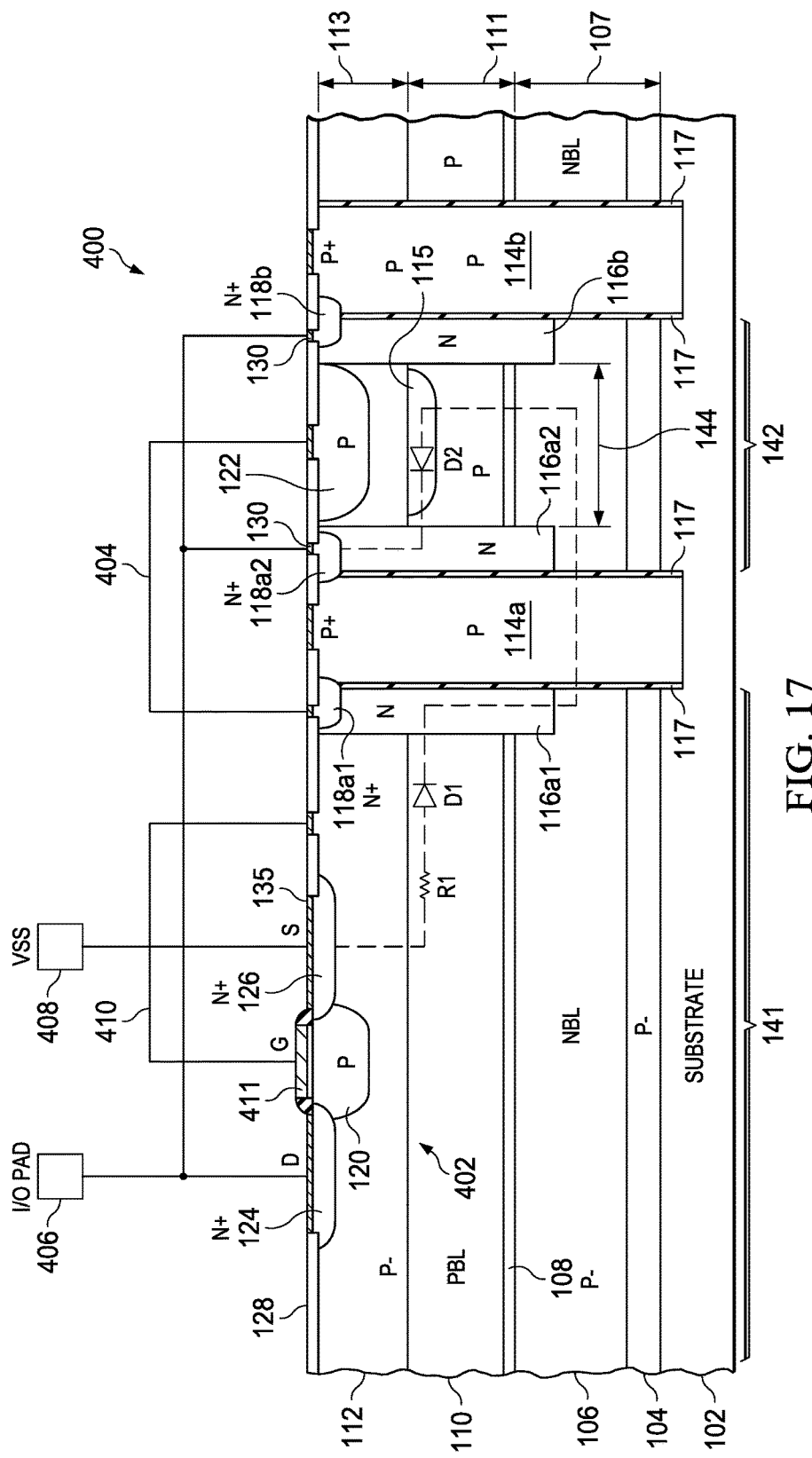
FIG. 17 is a partial sectional side elevation view showing another ESD protection circuit example including an NMOS protection transistor and a first diode formed in a first region of a semiconductor structure, as well as a second diode formed in a trench-isolated second region of the semiconductor structure.

As shown in FIG. 15, another example of the protection circuit 100 includes a protection transistor (e.g., a bipolar transistor 140 as shown in FIG. 1, a field effect transistor (FET) 402 as shown in FIGS. 4 and 17), with a resistor R1 and a first diode D1 formed in a first region 141 of a semiconductor structure and connected as described above. In this example, an integer number N second diodes D2-1, . . . , D2-N are connected in series with one another between a node 138 at the anode of the first diode D1 and the protected node 134. In normal operation, the expected signal voltages at the protected node 134 relative to the reference node 136 are such that the trigger diodes D1 and D2 do not suffer voltage breakdown. Accordingly, no current flows through the resistor R1, and the protection transistor 140, 402 is turned off. Multiple second diodes D2-1, . . . D2-N are interconnected in series with one another via one or more connections schematically designated as 1500 in FIG. 15. This allows design of the individual second diodes D2-1, . . . D2-N to provide any desired trigger voltage to operate the transistor 140, 402 in response to an ESD event at the protected node 134. When the signal voltage at the protected node 134 causes breakdown of the diodes D1, D2, breakdown current flows in the resistor R1 to raise the control terminal voltage of the protection transistor 140, 400. This turns on the protection transistor 140, 402 to discharge ESD current from the protected node 134.

In these embodiments, the deep trench diode stacks are implemented in separate deep trench structures 114 with associated deep N wells 116 as shown in the example of FIG. 16 using a lateral NPN protection transistor 140 as described above. In this case, the isolated P well of the bottom diode D1 in the stack is connected to the control terminal of the protection transistor 140 in the first region 141. The example in FIG. 16 includes a second diode D2-1 as previously described in a second region 142-1, formed by P-doped regions 110, 115 and 122, surrounded by illustrated deep N wells 116a2 and 116b1, with associated respective N+ doped shallow wells 118a2 and 118b1, separated from one another by a distance 144-1. In addition, a further (e.g., third) region 142-2 is laterally isolated from the first region 141 and from the second region 142-1 by another deep trench 114c and associated deep N wells 116b2 and 116c to define a third region 142-2. This example includes a further P well 115 in the region 142-2 to set a breakdown voltage of a third diode D2-2, as well as a P well 122 and an associated contact 131. The third diode D2-2 includes a third anode coupled by the contact 131 of the associated P well 122 with the second cathode 130. The diode D2-2 also includes a third cathode formed by the deep N wells 116b2 and 116c separated from one another by a distance 144-2, with corresponding N+ shallow wells 118b2 and 118c and associated contacts 132 connected through metallization structures (not shown) to the protected node 134. Although illustrated in combination with a bipolar protection transistor 140, this concept can be extended to other implementations using FET transistors (e.g., transistor 400 and FIG. 17 below) or other types and forms of protection transistor. In addition, any integer number N transistors D2 can be used, where N is greater than or equal to 1.

FIG. 17 illustrates another non-limiting ESD protection circuit example 400 corresponding to the schematic illustration of FIG. 4 above. In this case, an NMOS transistor 402 includes a drain terminal D and a source terminal S formed by corresponding N+ shallow wells or implant areas 124 and 126 with corresponding silicide contacts to connect the drain D with the protected node 406 and to connect the source S to a reference node 408 via a multilayer metallization structure (not shown). The protection transistor 402 in this example includes a gate G (e.g., a polysilicon gate structure 411 in FIG. 17) with a conductive contact to electrically couple the gate G through a metallization layer connection 410 with a P-doped portion of the first region 141 to form a connection with a resistor R1 and the anode of the first diode D1. The cathode of the diode D1 is formed by the deep N well 116a1, having a contact through N+ well 118a1 to a metallization layer connection 404 to the anode of the second transistor D2 in the second region 142. The further structures of the second region 142 are generally as described above in connection with FIG. 1 in order to provide controlled deep trench diode triggering to provide a gate voltage to control operation of the protection transistor 402 to respond to ESD events, while preventing false triggering when the signal voltages at the protected node 134 are in an expected normal operating range.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An electrostatic discharge (ESD) protection circuit, comprising:
   a protection transistor formed in a P-doped portion above an N buried layer of a first region of a semiconductor structure, the protection transistor including a first transistor terminal connected to a protected node, a second transistor terminal connected to a reference node, and a transistor control terminal;
   a first deep N well located in the first region, a second deep N well located in a second region of the semiconductor structure, and a deep trench located between the first and second regions;
   a first diode, including a first anode connected to the transistor control terminal in the P-doped portion of the first region, and a first cathode conductively coupled to the first deep N well;
   a resistor formed by the P-doped portion between the second transistor terminal and the transistor control terminal in the first region of the semiconductor structure; and
   a second diode formed in the second region, the second diode including a second anode conductively coupled to the first cathode via the first deep N well, the second diode further including a second cathode conductively coupled to the protected node via the second deep N well.

2. The ESD protection circuit of claim 1, wherein the semiconductor structure includes:
   a P-doped first epitaxial layer formed above a substrate, including an N buried layer formed in an upper portion of the first epitaxial layer,
   a P-doped second epitaxial layer formed above the first epitaxial layer, including a P buried layer formed in an upper portion of the second epitaxial layer,
   a P-doped third epitaxial layer formed above the second epitaxial layer, and
   wherein the deep trench extending downward through the first, second and third epitaxial layers and into the substrate between the first and second regions, the deep trench filled with P-doped polysilicon; and
   wherein the deep N well extends laterally outward from at least a portion of the deep trench and downward through the second and third epitaxial layers and into the N buried layer of the first epitaxial layer.

3. The ESD protection circuit of claim 2, wherein the protection transistor is an NPN bipolar transistor, including:
   a first N well formed in the third epitaxial layer to provide the first transistor terminal as a collector connected to the protected node;
   a second N well formed in the third epitaxial layer to provide the second transistor terminal as an emitter connected to the reference node; and
   a first P well formed in the third epitaxial layer to provide the transistor control terminal as a base connected to the first anode.

4. The ESD protection circuit of claim 3, further including a P well formed in the P buried layer of the second region adjacent the second deep N well.

5. The ESD protection circuit of claim 3, further including a third diode formed in a third region laterally isolated from the first region and from the second region by another deep trench in the semiconductor structure, the third diode including a third anode coupled with the second cathode, and a third cathode coupled with the protected node.

6. The ESD protection circuit of claim 5, further including a second P well formed in the P buried layer of the third region.

7. The ESD protection circuit of claim 2, wherein the protection transistor is an NMOS transistor, including:
   a first N well formed in the third epitaxial layer to provide the first transistor terminal as a drain connected to the protected node;
   a second N well formed in the third epitaxial layer to provide the second transistor terminal as a source connected to the reference node; and a first P well formed in the third epitaxial layer to provide the transistor control terminal as a gate connected to the first anode.

8. The ESD protection circuit of claim 7, further including a P well formed in the P buried layer of the second region adjacent the second deep N well.

9. The ESD protection circuit of claim 7, further including a third diode formed in a third region laterally isolated from the first region and from the second region by another deep trench in the semiconductor structure, the third diode including a third anode coupled with the second cathode, and a third cathode coupled with the protected node.

10. The ESD protection circuit of claim 9, further including a second P well formed in the P buried layer of the third region.

11. The ESD protection circuit of claim 1, further including a third diode formed in a third region laterally isolated from the first region and from the second region by another deep trench in the semiconductor structure, the third diode including a third anode coupled with the second cathode, and a third cathode coupled with the protected node.

12. The ESD protection circuit of claim 11, further including a P well formed in the P buried layer of the second region adjacent the second deep N well.

13. The ESD protection circuit of claim 12, further including a second P well formed in the P buried layer of the third region.

14. An integrated circuit (IC), comprising:
a semiconductor structure, including:
a P-doped epitaxial layer formed above a substrate,
a P buried layer located within the epitaxial layer,
an N buried layer located within the P-doped epitaxial layer between the P buried layer and the substrate;
a deep trench filled with P-doped polysilicon and extending downward through the P buried layer and the N buried layer and into the substrate between first and second regions of the semiconductor structure,
a first deep N well extending laterally outward from at least a portion of the deep trench and downward through the P buried layer and into the N buried layer in the first region, and
a second deep N well extending laterally outward from at least a portion of the deep trench and downward through the P buried layer and into the N buried layer in the second region;
a protected node; and
an electrostatic discharge (ESD) protection circuit, including:
a protection transistor formed in the third epitaxial layer in the first region, including a first transistor terminal connected to the protected node, a second transistor terminal connected to a reference node, and a transistor control terminal,
a first diode located within the first region, including a first anode connected to the transistor control terminal in the first region, and a first cathode formed by the first deep N well in the first region,
a resistor formed between the second transistor terminal and the transistor control terminal in the first region, and
a second diode located within the second region, including a second anode formed in the second and third epitaxial layers in the second region and connected to the first cathode, and a second cathode formed in the second deep N well in the second region and coupled with the protected node.

15. The IC of claim 14, further including a P well formed in the P buried layer of the second region adjacent the second deep N well.

16. The IC of claim 14, further including a third diode formed in a third region laterally isolated from the first region and from the second region by a second deep trench in the semiconductor structure, the third diode including a third anode coupled with the second cathode, and a third cathode coupled with the protected node.

17. The IC of claim 16, further including a second P well formed in the P buried layer of the third region.

* * * * *